US008934286B2

(12) United States Patent
Barth, Jr. et al.

(10) Patent No.: US 8,934,286 B2
(45) Date of Patent: Jan. 13, 2015

(54) COMPLEMENTARY METAL-OXIDE-SEMICONDUCTOR (CMOS) DYNAMIC RANDOM ACCESS MEMORY (DRAM) CELL WITH SENSE AMPLIFIER

(71) Applicant: International Business Machines Corporation, Armonk, NY (US)

(72) Inventors: John E. Barth, Jr., Williston, VT (US); Adis Vehabovic, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 13/747,529

(22) Filed: Jan. 23, 2013

(65) Prior Publication Data
US 2014/0204654 A1    Jul. 24, 2014

(51) Int. Cl.
G11C 8/16       (2006.01)
G11C 11/403     (2006.01)
G11C 11/4094    (2006.01)
G11C 11/4096    (2006.01)

(52) U.S. Cl.
CPC ........... *G11C 8/16* (2013.01); *G11C 11/403* (2013.01); *G11C 11/4094* (2013.01); *G11C 11/4096* (2013.01)
USPC .......................................... 365/149; 365/190

(58) Field of Classification Search
CPC .............. G11C 11/405; C11C 11/4097; H01L 27/0207; H01L 21/28525
USPC .......... 365/149, 186, 187, 189.011, 205, 190, 365/207
See application file for complete search history.

(56) References Cited

U.S. PATENT DOCUMENTS

| 5,856,940 | A  * | 1/1999  | Rao .............................. 365/149 |
| 6,608,787 | B1   | 8/2003  | Daga et al. |
| 7,123,500 | B2   | 10/2006 | Ye et al. |
| 7,277,316 | B2   | 10/2007 | Turner |
| 7,408,218 | B2   | 8/2008  | Akiyama et al. |
| 7,642,588 | B2 * | 1/2010  | Cheng et al. .................. 257/302 |
| 8,045,360 | B2   | 10/2011 | Kajigaya |
| 8,130,532 | B2   | 3/2012  | Kurjanowicz et al. |
| 8,164,942 | B2   | 4/2012  | Gebara et al. |
| 2005/0146921 | A1 | 7/2005 | Ye et al. |
| 2006/0221746 | A1 | 10/2006 | Kang et al. |
| 2008/0265300 | A1* | 10/2008 | Akiyama et al. .............. 257/311 |
| 2011/0051542 | A1 | 3/2011 | Katoch et al. |
| 2011/0222361 | A1 | 9/2011 | Mazure et al. |
| 2012/0008445 | A1 | 1/2012 | Parris et al. |

* cited by examiner

*Primary Examiner* — Hoai V Ho
*Assistant Examiner* — Kun Xu
(74) *Attorney, Agent, or Firm* — David A. Cain; Hoffman Warnick LLC (57) ABSTRACT

A complementary metal-oxide-semiconductor (CMOS) dynamic random access memory (DRAM) cell with sense amplifier is described. In one embodiment, the DRAM cell includes an n-type field-effect transistor (NFET), a p-type field-effect transistor (PFET), and a storage capacitor accessed through both the NFET and the PFET. A pair of bit lines is coupled to the DRAM cell. A sense amplifier with a single-ended read path reads data in the DRAM cell through only one of the bit lines and a data-dependent write-back path writes back data to the DRAM cell through either one of the bit lines. The bit line used by the sense amplifier to write back the data to the DRAM cell depends on the logical value of the data.

25 Claims, 8 Drawing Sheets

COMPLEMENTARY METAL-OXIDE-SEMICONDUCTOR (CMOS) DYNAMIC RANDOM ACCESS MEMORY (DRAM) CELL WITH SENSE AMPLIFIER

BACKGROUND

The present invention relates generally to integrated circuit (IC) memory devices, and more specifically, to a complementary metal-oxide-semiconductor (CMOS) dynamic random access memory (DRAM) cell and sense amplifier.

One commonly known DRAM cell is of the type that uses a single transistor to access data stored in a capacitor as a charge. A memory circuit formed from an array of these DRAM cells can have a single bit line serving all of the cells in a given column of the array. In this manner, data stored in one of the DRAM cells in the memory circuit can be read from the cell's capacitor through its respective bit line in response to a word line activating the cell. Single transistor DRAM cells that are deployed in a memory circuit with each having a word line that activates the cell are subject to high levels of stress during activation and inactivation. This can degrade the performance of the memory circuit. In particular, every time that one of these single transistor DRAM cells is turned on and off, the cells' respective word line can have voltage swings greater than 2.0 Volts (V). For example, consider a "high" logic level used in a digital circuit that can be represented by 1.0 V and a "low" logic level that can be represented by 0 V. In order to ensure that a good value is read out of the DRAM cell (e.g., a charge transfer of about 70% of the charge from the cell capacitor to the bit line), 1.5 V is typically applied to the transistor associated with the cell by its word line for activation. Because a DRAM cell is subject to charge leakage, -0.4 V is typically applied to the transistor by the word line during shut off of the transistor in order to minimize source to drain leakage. This negative voltage will shut off the transistor harder, enabling it to have an acceptable retention time. A 2 V swing across the gate of the transistor to facilitate such "hard" activations and shut-offs creates excessive stress for the transistor.

A CMOS DRAM cell is one type of DRAM that has been proposed to address the word line swing issues associated with the single transistor DRAM cell that deploys its own word line. One type of CMOS DRAM cell uses an n-type field-effect transistor (NFET) and a p-type field-effect transistor (PFET) to access data that is stored in a capacitor. A memory circuit formed from an array of these CMOS DRAM cells can have a single bit line serving all of the cells in a given column of the array. In this manner, data stored in a capacitor in one of the CMOS DRAM cells in the memory circuit can be accessed through either the cell's NFET or PFET, and be read and written to, by the bit line associated with the cell, in response to a word line activating the cell.

CMOS DRAM cells that are deployed in a memory circuit to have a word line that activates the NFET and a separate word line to activate the PFET are not subject to voltage swings at the gates of the transistors that cause high levels of stress during their activation and inactivation. In particular, the word line at the NFET will only need to swing from a negative voltage (e.g., -0.35 V) to a supply voltage during its activation and inactivation, while the PFET will only need to swing from a positive voltage (e.g., 1.5 V) to ground during its activation and inactivation. The swing on the word line in this configuration is reduced in comparison to the DRAM cell with the single transistor. However, this type of CMOS DRAM cell configuration doubles the capacitance on the bit line because more transistors are coupled to it. This reduces the charge transfer ratio and associated bit line signal. In addition, when the bit line is precharged to ground, a silicon-on-insulator (SOI) PFET body of the device leaks low, causing degradation to the off current and hence degraded retention. Similarly, when the bit line is precharged to a supply voltage, an SOI NFET body of the device leaks high, causing degradation to the off current and hence degraded retention. For the above reason, the single bit line configuration is less desirable to use with a CMOS DRAM cell.

SUMMARY

In one embodiment, a dynamic random access memory (DRAM) cell is disclosed. The DRAM cell comprises a pair of bit lines and a storage capacitor. An n-type field-effect transistor (NFET) access transistor selected by a first word line couples the storage capacitor to one of the pair of bit lines. A p-type field-effect transistor (PFET) access transistor selected by a second word line couples the storage capacitor to another of the pair of bit lines. In this embodiment, only one bit line from the pair of bit lines is used to perform a read operation on data in the storage capacitor and both of the bit lines from the pair of bit lines are used to perform a data-dependent write-back operation to the storage capacitor.

In a second embodiment, a circuit is disclosed. In this embodiment, the circuit comprises a DRAM cell including an NFET, a PFET, and a storage capacitor accessed through both the NFET and the PFET. The circuit further comprises a pair of bit lines formed from a first bit line and a second bit line, wherein the first bit line is coupled to the NFET and the second bit line is coupled to the PFET. The circuit also includes a sense amplifier that reads data in the DRAM cell only through the first bit line and writes back data to the DRAM cell through either the first bit line or the second bit line. The first bit line is used for writing back a logical "0" value to the DRAM cell and the second bit line is used for writing back a logical "1" value to the DRAM cell.

In a third embodiment, there is a memory circuit. In this embodiment, the memory circuit comprises at least one DRAM cell including an NFET, a PFET, and a storage capacitor accessed through both the NFET and the PFET. The memory circuit further comprises a pair of bit lines formed from a first bit line and a second bit line, wherein the first bit line is coupled to the NFET and the second bit line is coupled to the PFET. The memory circuit also comprises a sense amplifier having a single-ended read path and a data-dependent write-back path each coupled to the DRAM cell. The sense amplifier reads data in the DRAM cell only through the first bit line and writes back data to the DRAM cell through one of the first bit line and the second bit line. The first bit line is used for writing back a logical "0" value to the DRAM cell and the second bit line is used for writing back a logical "1" value to the DRAM cell.

DETAILED DESCRIPTION

Figure 1:
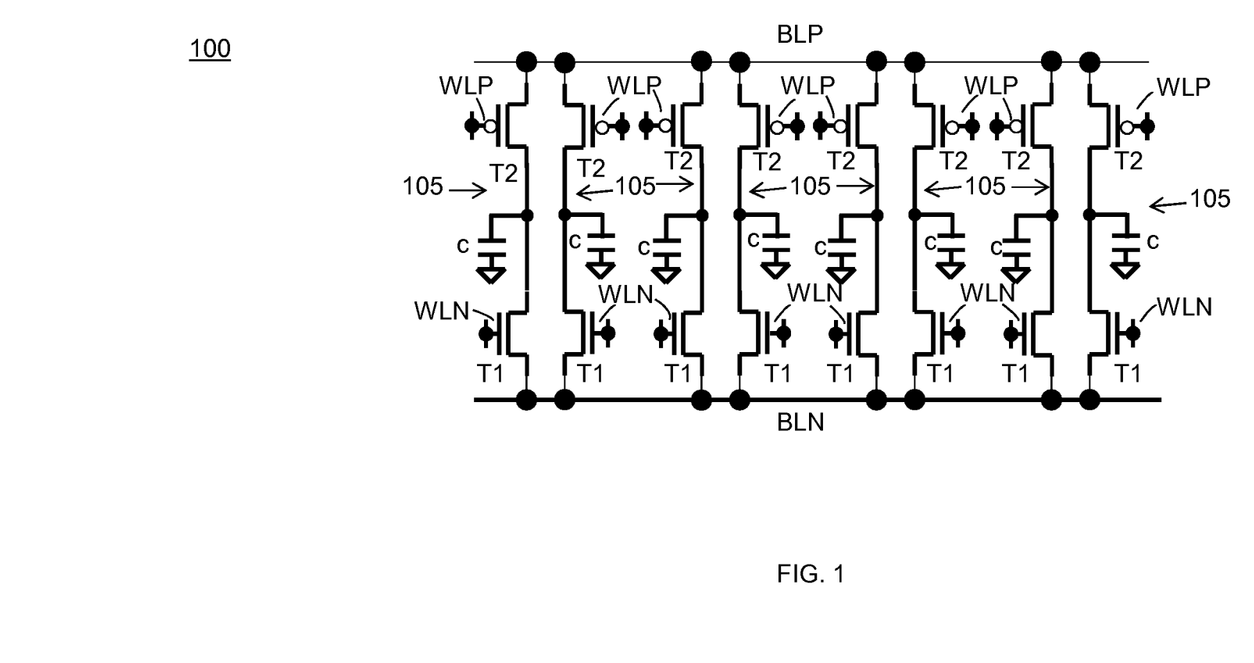
FIG. 1 shows a schematic of a memory circuit having complementary metal-oxide-semiconductor (CMOS) dynamic random access memory (DRAM) cells according to an embodiment of the present invention.

Referring to FIG. 1, there is a schematic of a memory circuit 100 having complementary metal-oxide-semiconductor (CMOS) dynamic random access memory (DRAM) cells 105 according to an embodiment of the present invention. Each CMOS DRAM cell 105 includes an n-type field-effect transistor (NFET) access transistor T1 selected by a word line WLN, and a p-type field-effect transistor (PFET) access transistor T2 selected by a word line WLP. A storage capacitor C is coupled to both NFET T1 and PFET T2 at one end and to ground at the other end. A pair of bit lines BLN and BLP is coupled to capacitor C by one of the access transistors (T1 and T2). The use of two bit lines, as opposed to the one bit line that is used in the commonly known CMOS DRAM cell configurations, obviates the issue associated with having double capacitance on a bit line. In one embodiment, as shown in FIG. 1, bit line BLN is coupled to each NFET T1 and bit line BLP is coupled to each PFET T2. In this manner, bit line BLN can be precharged to ground and bit line BLP can be precharged to a supply voltage VDD. In this configuration, as explained below in more detail, only one bit line from the pair of bit lines BLN and BLP can be used to perform a read operation, while both bit lines BLN and BLP can be used to perform a data-dependent write operation. For example, in one embodiment, only bit line BLN can be used to read data stored in capacitor C as a charge, while both bit line BLN and bit line BLP can be used to write data to capacitor C. In one embodiment, bit line BLN can be used for writing a logical "0" value to capacitor C and bit line BLP can be used for writing a logical "1" value to capacitor C. Bit lines BLN and BLP could be used differently, however, those skilled in the art will appreciate that the sense amplifier used to read and write such a cell configuration would have to be modified from the approach described below in order to accommodate any changes made to the bit lines.

Figure 2:
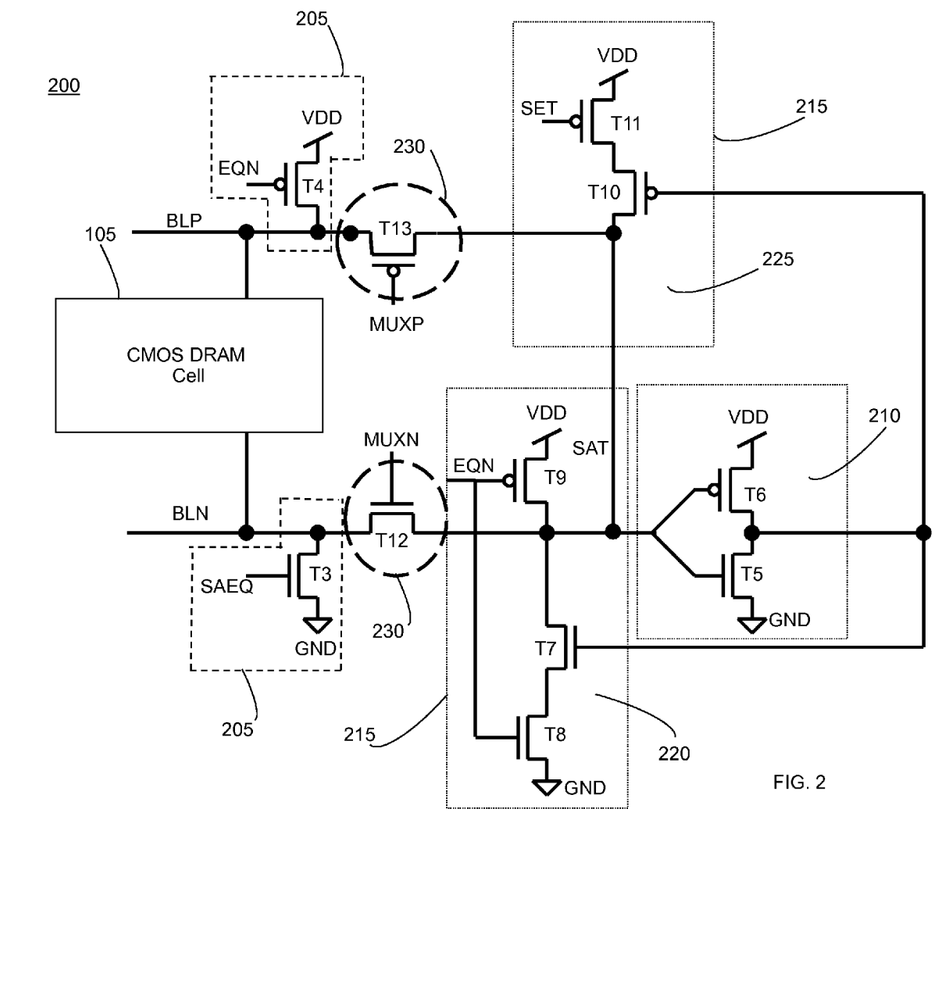
FIG. 2 shows a schematic of a sense amplifier used with one of the CMOS DRAM cells depicted in FIG. 1 according to an embodiment of the present invention.

FIG. 2 shows a schematic of a sense amplifier 200 used with one of the CMOS DRAM cells 105 depicted in FIG. 1 according to an embodiment of the present invention. Sense amplifier 200 has a single-ended read path and a data-dependent write-back path each coupled to the DRAM cell. In one embodiment, sense amplifier 200 can read data in DRAM cell 105 only through bit line BLN and write data to the DRAM cell through either bit line BLN or bit line BLP, depending on the logical value of the data. In one embodiment, bit line BLN can be used for writing a logical "0" value to DRAM cell 105 and bit line BLP can be used for writing a logical "1" value to the DRAM cell.

As shown in FIG. 2, sense amplifier 200 can include a precharge component 205 that precharges bit line BLN and bit line BLP. One part of precharge component 205 includes NFET T3 tied to bit line BLN, and ground GND and controlled by a signal SAEQ. Another part of precharge component 205 includes PFET T4 tied to bit line BLP and a supply voltage VDD, and controlled by a signal EQN. In this manner, precharge component 205 can precharge bit line BLP to VDD and bit line BLN to GND.

Sense amplifier 200 can also include a sense inverter 210, having an input and an output, coupled to bit lines BLN and BLP. As shown in FIG. 2, sense inverter 210 is formed from NFET T5 and PFET T6. The gates of NFET T5 and PFET T6 can be tied to receive bit line BLN as input, while the drains of these transistors are coupled together. In addition, the source of NFET T5 is tied to GND and the source of PFET T6 is tied to VDD.

Sense amplifier 200 can further include a write-back component 215 that can write back data from sense inverter 210 to DRAM cell 105 along either one of bit lines BLN and BLP. As shown in FIG. 2, write-back component 215 can include a logical "0" write-back path 220 coupling the part of precharge component 205 that precharges bit line BLN to sense inverter 210. Logical "0" write-back path 220 includes NFET T7 coupled at its gate to the output from sense inverter 210. NFET T7 is coupled to NFET T8 and PFET T9. Both NFET T8 and PFET T9 are controlled by a signal EQN. NFET T8 will propagate GND to NFET T7 when activated by EQN, while PFET T9 will propagate VDD onto bit line BLN and a node SAT that is off of BLN (PFET T9 also serves as a precharge device for this common node). As explained below in more detail, logical "0" write-back path 220 can write a logical "0" value to DRAM cell 105 along bit line BLN in order to refresh the cell in instances where a "0" is read from the cell.

Write-back component 215 as shown in FIG. 2 can also include a logical "1" write-back path 225 coupling the part of precharge component 205 that precharges bit line BLP to sense inverter 210. Logical "1" write-back path 225 can include PFET T10 coupled at its gate to the output from sense inverter 210. PFET T10 can be coupled to PFET T11 and to logical "0" write-back path 220 along common node SAT. PFET T10 is controlled by the logical value at the output of sense inverter 210, while PFET T11 is controlled by a signal SET. In this manner, PFET T11 will propagate VDD to PFET T10 when activated by SET, and PFET T10 can propagate VDD through PFET T10 onto bit line BLP if the gate of this transistor has been activated by the output from sense inverter 210 (i.e., a "0" or "low"). As explained below in more detail, logical "1" write-back path 225 can write a logical "1" value to DRAM cell 105 along bit line BLP in order to refresh the cell in instances where a "1" is read from the cell.

FIG. 2 also shows that sense amplifier 200 can include an isolator device 230 that separates bit lines BLN and BLP from sense inverter 210 and write-back component 215. As shown in FIG. 2, isolator device 230 includes a part that separates bit line BLN from sense inverter 210 and logical "0" write-back path 220. This part utilizes an NFET T12 controlled by a signal MUXN. In this manner NFET T12 can isolate bit line BLN from sense inverter 210 and logical "0" write-back path 220 while it is precharging and obtaining a value from DRAM cell 105. For example, if a logical "0" is to be read from DRAM cell 105, then NFET T12 will be held inactive by MUXN (i.e., apply a "low"), thereby separating bit line BLN from sense inverter 210 and logical "0" write-back path 220. Because bit line BLN can be precharged to GND, the charge in the DRAM cell 105 indicative of a logical "0" can be developed faster on BLN. Once the data has been developed on bit line BLN, signal MUXN will go "high" and turn on NFET T12, allowing bit line BLN to apply the "0" value to sense inverter 210. If a logical "1" value is to be read from DRAM cell 105, then again NFET T12 will be held inactive by MUXN (i.e., apply a "low"), thereby separating bit line BLN from sense inverter 210 and logical "0" write-back path 220. Because bit line BLN can be precharged to GND, the charge in the DRAM cell 105 indicative of logical "1" will take a little longer to develop on BLN as opposed to instances when a logical "0" is in the cell. Once the data has been developed on bit line BLN, MUXN will go high and turn on NFET T12, allowing the BLN to apply the logical "1" value to sense inverter 210.

As explained below in more detail, while bit line BLN is precharged to GND, isolator device 230 enables SAT node to be precharged to a "high". In particular, while NFET T12 is held inactive by a "low" MUXN, a "low" EQN is applied to PFET T9. Supply voltage VDD can then propagate through PFET T9 and precharge SAT node to a "high" or a logical "1" value. After bit line BLN has been precharged to GND and a logical "0" value is developed on bit line BLN, MUXN will go "high" connecting bit line BLN with SAT node and sense inverter 210. This will discharge the high or logical "1" value on SAT node and flip the state of sense inverter 210.

Another part of isolator 230 as shown in FIG. 2 separates bit line BLP from sense inverter 210 and logical "1" write-back path 225. This part utilizes a PFET T13 controlled by a signal MUXP. In this manner PFET T13 can isolate bit line BLP from sense inverter 210 and logical "1" write-back path 225, after BLP is done precharging and a value is being obtained from DRAM cell 105. During a write-back period, MUXP will activate PFET T13 (i.e., apply a "low"), thereby coupling bit line BLP with logical "1" write-back path 225 and the node SAT. If a logical "1" has been read from DRAM cell 105 then it will be written back to the cell through logical "1" write-back path 225 along bit line BLP. If a logical "0" has been read from DRAM cell 105 then it can be written back to the cell through logical "0" write-back path 220 along bit line BLN.

Figure 3:
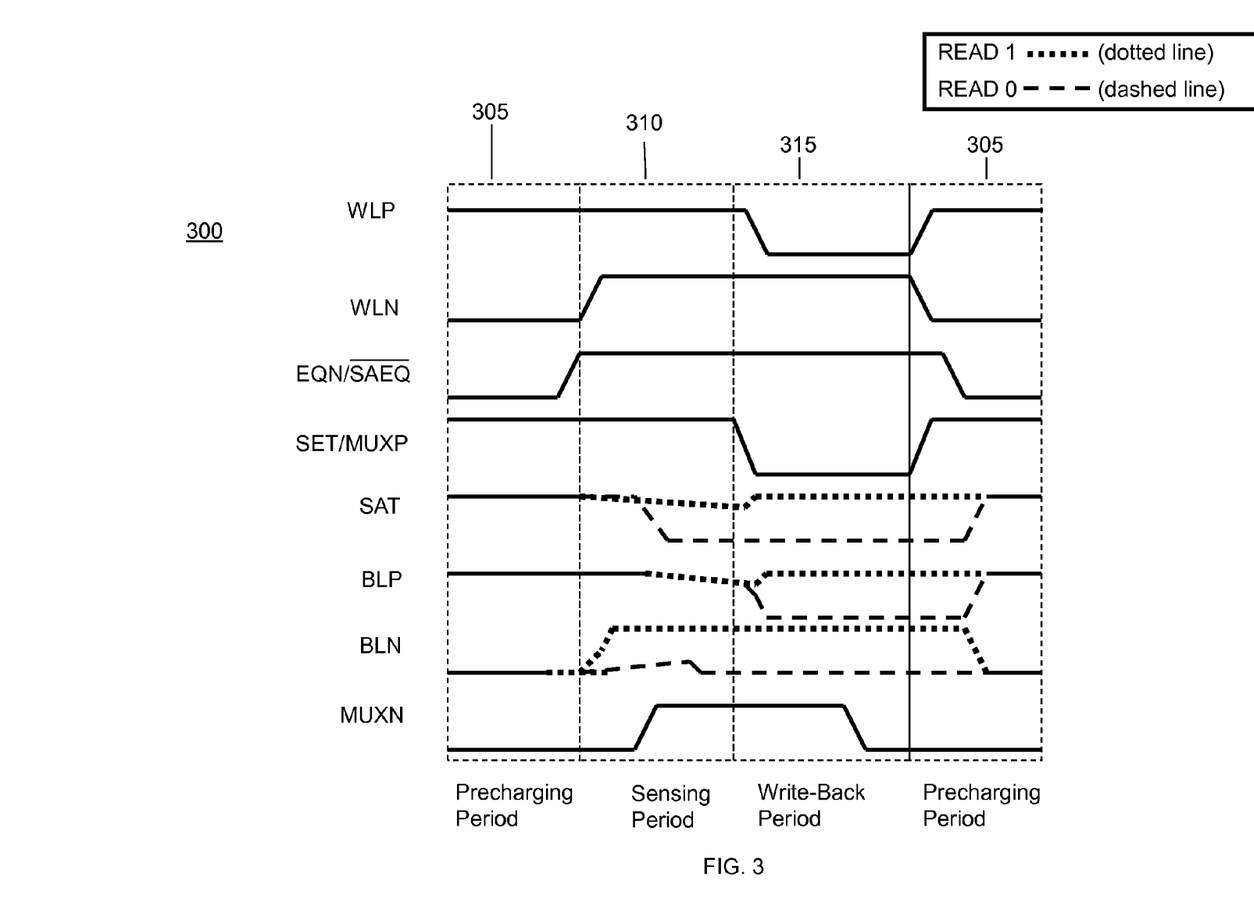
FIG. 3 is a timing diagram that illustrates the operation of the sense amplifier depicted in FIG. 2 according to an embodiment of the present invention.

FIG. 3 is a timing diagram 300 that illustrates the operation of sense amplifier 200 with DRAM cell 105 according to an embodiment of the present invention. As shown in FIG. 3, the operation of sense amplifier 200 can be illustrated by four periods, a precharging period 305, a sensing or reading period 310, a write-back period 315 and a transition back to pre-charging period 305. Below is a more detailed explanation of how DRAM cell 105 and sense amplifier 200 in FIG. 2 can operate during each of these periods depicted in timing diagram 300.

In precharging period 305, bit lines BLN and BLP are precharged to opposite values. In particular bit line BLN can be precharged to GND and bit line BLP can be charged to VDD. In one embodiment, during this precharging period 305, signal SAEQ goes "high" which activates or turns on NFET T3 (note that FIG. 3 shows the complement of SAEQ). This causes GND to propagate through NFET T3 onto bit line BLN, precharging it to GND. Note that signal MUXN is "low", keeping NFET T12 off or inactive, thereby isolating bit line BLN from logical "0" write-back path 220 and sense inverter 210. While bit line BLN is precharged to GND, bit line BLP is charged to VDD. In particular, during this precharging period 305, signal EQN is "low" causing PFET T4 to activate. Supply voltage VDD can then propagate through PFET T4 onto bit line BLP, precharging it to VDD. Note that signal MUXP is "high", keeping PFET T13 off, thereby isolating bit line BLP from logical "1" write-back path 225 and sense inverter 210.

Also during this precharging period 305, signal SET is "high" keeping PFET T11 in logical "1" write-back path 225 off. In addition, because signal EQN is low, PFET T9 (also controlled by signal EQN) will be active. This causes VDD to propagate through PFET T9 onto node SAT, precharging it high. A signal EQN that is "low" keeps NFET T8 in logical "0" write-back path 220 inactive or off. Also, during this precharging period 305, word line WLN is low indicating that the NFET access transistor (T1 in FIG. 1) has not yet been selected. Also as illustrated in FIG. 3, word line WLP will be high during this instance, keeping PFET access transistor (T2 in FIG. 1) inactive.

During sensing period 310, data in DRAM cell 105 is ready to be read or sensed by sense amplifier 200. As a result, word line WLN goes high enabling bit line BLN to obtain the data in DRAM cell 105. As noted herein, only one of the pair of bit lines BLN and BLP is used to read data in the DRAM cell. In this embodiment, bit line BLN is the bit line of the pair of bit lines that can be used to read the data from DRAM cell 105.

Also during sensing period 310, as shown in FIG. 3, signal EQN goes "high" while signal SAEQ goes "low". Signal EQN going "high" causes PFET T4 to turn off and PFET T9 to turn off and NFET T8 to turn on, while signal SAEQ going "low" causes NFET T3 to also turn off. This ceases the pre-charging of the bit lines, generally leaving bit line BLP pre-charged to VDD and bit line BLN precharged to GND as shown in FIG. 3. Below are more details regarding bit lines BLN and BLP during sensing period 310 in instances in which a logical "1" value or a logical "0" value is read from DRAM cell 105.

As mentioned above, NFET T12 and PFET T13 (i.e., isolator device 230) are used to separate bit line BLN from sense inverter 210 and logical "0" write-back path 220, and bit line BLP from sense inverter 210 and logical "1" write-back path 225, respectively. In sensing period 310, signal MUXP continues to be high, keeping PFET T13 off, and thus bit line BLP still separated from sense inverter 210 and logical "1" write-back path 225. Note that in FIG. 3, signal SET which is illustrated along with signal MUXP, is still at "high", keeping PFET T11 off. Signal MUXN will go from a "low" to a "high" during sensing period 310, turning on NFET T12. This connects bit line BLN with sense inverter 210 and logical "0" write-back path 220.

If during sensing period 310, a logical "1" value is read from DRAM cell 105, the SAT node continues to stay substantially near "high" even after signal EQN goes "high" turning off PFET T9. This is shown in sensing period 310 of FIG. 3, by illustrating the SAT node with a dotted line (indicative of a "1" being read). Using the dotted line key further to illustrate the reading of a logical "1" value, FIG. 3 shows that bit line BLP stays substantially at high during sensing period 310 while bit line BLN charges up high. Bit line BLP and bit line BLN do not stay at their precharged values because once word line WLN goes "high" it will turn on the NFET access transistor in DRAM cell 105 (e.g., NFET T1 of FIG. 1), coupling the cell to bit line BLN. This will discharge the logical "1" value onto bit line BLN, so that BLN goes from a precharged "low" state to a "high" state from the cell, when sensing a logical "1" value. Also, once signal MUXN goes "high" turning on NFET T12 of isolator device 230, it will couple bit line BLN to node SAT and sense inverter 210 will stay "high" for a logical "1" value read from cell 105.

For clarity in describing the operation of sense amplifier 205, the description continues with the reading of a logical "1" value along bit line BLN and writing of the "1" back to DRAM cell 105 along bit line BLP. A logical "1" value applied to sense inverter 210 causes it to generate a logical "0" value at the output of the inverter. A logical "0" value at the output of sense inverter 210 precludes logical "0" write-back path 220 from operating because NFET T7 does not activate with this value. However, a logical "0" value at the output of sense inverter 210 causes PFET T10 of logical "1" write-back path 225 to turn on, and to start with writing of the "1" back to DRAM cell 105 along bit line BLP. As shown in FIG. 3 during write-back period 315, word line WLN and signal EQN are still held high. In addition, signals SET and MUXP go low during write-back period 315. A low SET signal turns on PFET T11, causing VDD to propagate through this transistor and through PFET T10 since a "low" generated from sense inverter 210 causes T10 to turn on. Also during this instance, node SAT which is illustrated as being slightly less than "high", is pulled up to "high" by the conducting of PFETS T11 and T10. This causes bit line BLP at the direct coupling to logical "1" write-back path 225 to be pulled from slightly less than "high" (due to leakage of the bit line from the precharging period) to a "high" (i.e., a "1"). Note that during write-back period 315 for the read of a logical "1" value, bit line BLN goes "high" because this value is carried along bit line BLN to sense inverter 210 with signal MUXN turning on. Since signal MUXP goes "low" during write-back period, PFET T13 will turn on, connecting bit line BLP with DRAM cell 105. As shown in FIG. 3, word line WLP is "low", enabling bit line BLP to write the logical "1" back into the storage capacitor of DRAM cell 105.

If during sensing period 310, a logical "0" value is read from DRAM cell 105, then sense amplifier 200 would operate in a different manner. For example, for a read of a logical "0" value, certain aspects in sensing period 310 and write-back period 315 are illustrated with a dashed line. When signal MUXN goes high during sensing period 310 for a read "0", turning on NFET T12 to connect bit line BLN with sense inverter 210, bit line BLN will rise slightly from "low" or its precharged state of GND due to the charge sharing with node SAT. Sensing period 310 further shows that for a read "0", node SAT will discharge to a "low", causing bit line BLN to continue to be slightly above a "low" value before settling back to a "low" as write-back period 315 begins.

During write-back period 315, a "0" on bit line BLN causes sense inverter 210 to generate a "1" at its output. A logical "1" value at the output of sense inverter 210 precludes logical "1" write-back path 225 from operating because PFET T10 does not activate with this value. This keeps bit line BLP at a "low" during the read and write-back of a logical "0" from DRAM cell 105. A logical "1" value at the output of sense inverter 210 causes NFET T7 of logical "0" write-back path 220 to turn on and to start with writing of a "0" back to DRAM cell 105 along bit line BLN. As shown in FIG. 3 during write-back period 315, word line WLN and signal EQN are still held "high". A "high" EQN signal turns on NFET T8, causing GND to propagate through this transistor and through NFET T7 since a "high" generated from sense inverter 210 causes T7 to turn on. This causes a "low" value or a "0" to be placed on bit line BLN. During this instance, node SAT will continue to be held at a "low" as indicated by the dotted line for the read and write-back of a logical "0" value. This ensures that bit line BLN stays "low" with a "0" logical value. Since signal MUXN is "high" during write-back period, NFET T12 continues to be on, connecting bit line BLN with DRAM cell 105. With word line WLN being on, bit line BLN can then write a logical "0" back into the storage capacitor of DRAM cell 105.

Note that during the write-back period 315, while writing either a logical "1" value through bit line BLP or a logical "0" value through bit line BLN, FIG. 3 shows that the both bit lines are driven to essentially the same voltage level during write back. In one embodiment, during the writing back of a logical "0" value, bit line BLN can have a full ground level, while bit line BLP can have a ground level plus a PFET threshold voltage. In one embodiment, during the writing back of a logical "1" value, bit line BLP can have a full supply voltage level, while bit line BLN can have the supply voltage minus a NFET threshold voltage.

Upon writing back a logical "1" value through bit line BLP or a logical "0" value through bit line BLN, the operation of sense amplifier 200 shifts back to a precharging period 305. As shown in FIG. 3, during this transitioning part of precharging period 305, word line WLN goes low turning off the NFET access transistor associated with the DRAM cell 105 and WLP goes high turning off the PFET access transistor associated with the DRAM cell 105. In addition, signal EQN goes low turning on PFET T4 and PFET T9. Turning on PFET T4 starts the precharging of bit line BLP to VDD, while activation of PFET T9 allows SAT node to be precharged to VDD. As shown in FIG. 3, regardless of whether a "1" or a "0" was written to DRAM cell 105, the SAT node and bit line BLP signal converges back to VDD. In addition, during this precharging period, signal SAEQ will go "high" which activates or turns on NFET T3. As mentioned above, this causes GND to propagate through NFET T3 onto bit line BLN, precharging it to GND. While bit line BLP is precharged to VDD and bit line BLN is precharged to GND, signal MUXN is low and signal MUXP is high. This isolates bit line BLN from logical "0" write-back path 220 and sense inverter 210, and isolates bit line BLP from logical "1" write-back path 225 and sense inverter 210. Also as noted above, during the precharging period 305, signal SET is "high" keeping PFET T11 in logical "1" write-back path 225 off. In addition, as mentioned above, a "low" signal EQN keeps NFET T8 in logical "0" write-back path 220 inactive or off during precharging period 305.

Figure 4:
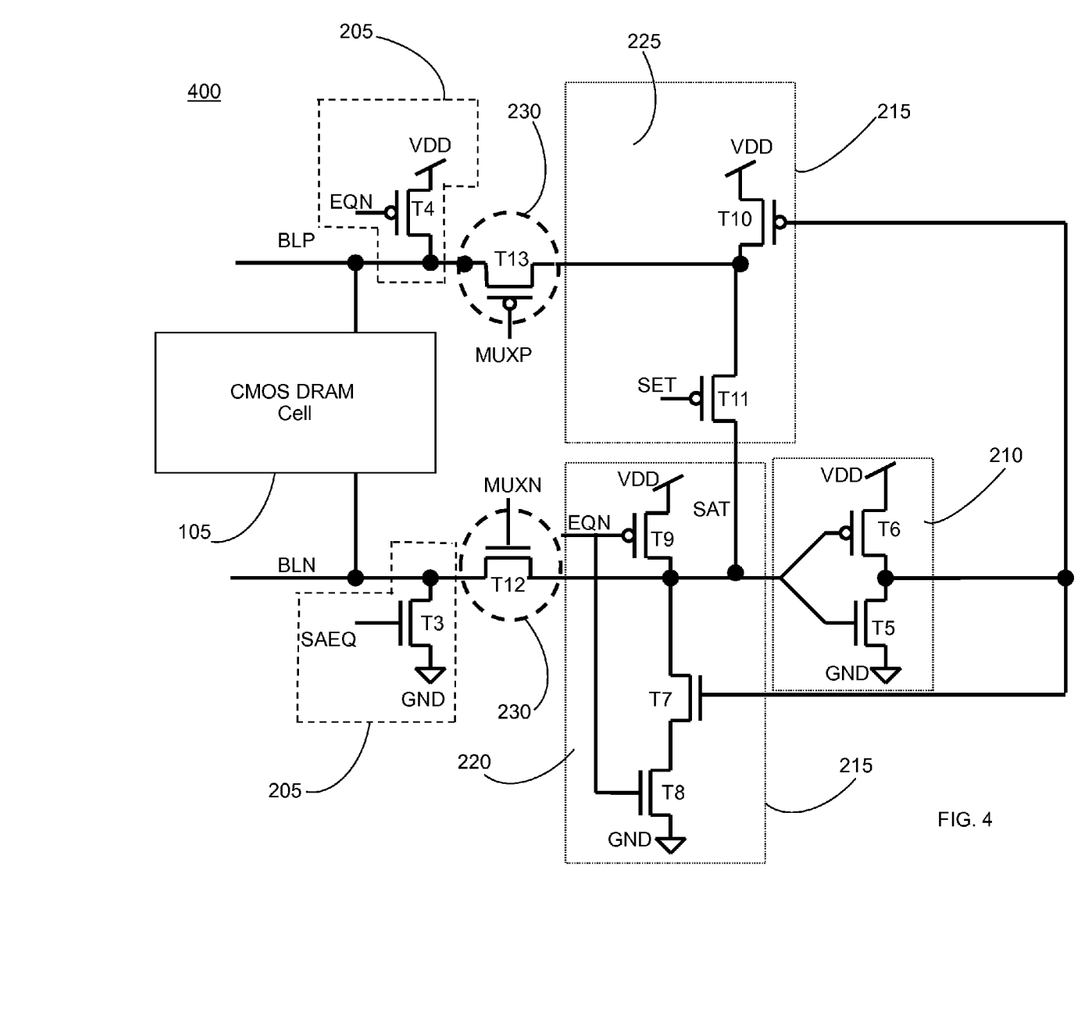
FIG. 4 shows a schematic of a sense amplifier according to an alternative embodiment of the present invention.

FIG. 4 shows a schematic of a sense amplifier 400 according to an alternative embodiment of the present invention. In this embodiment, sense amplifier 400 differs from the sense amplifier illustrated in FIG. 2 in that PFET T11 controlled by signal SET has been moved from being a header and placed on node SAT. This reduces the capacitance on node SAT, which allows this node to discharge even faster when a logical "0" value is read, in turn flipping sense inverter 210 even faster. The overall timing operation of sense amplifier 400 will be substantially the same as that described earlier for sense amplifier 200 and illustrated in FIG. 3. The only difference is that during the write of a logical "1" value during write-back period 315, signal SET will turn on PFET T11, coupling node SAT with bit line BLP. This occurs while VDD propagates through an active PFET T10 turned on by a "low" generated from sense inverter 210. Bit line BLP can then write a "1" to DRAM cell 105 in the aforementioned manner.

Figure 5A:
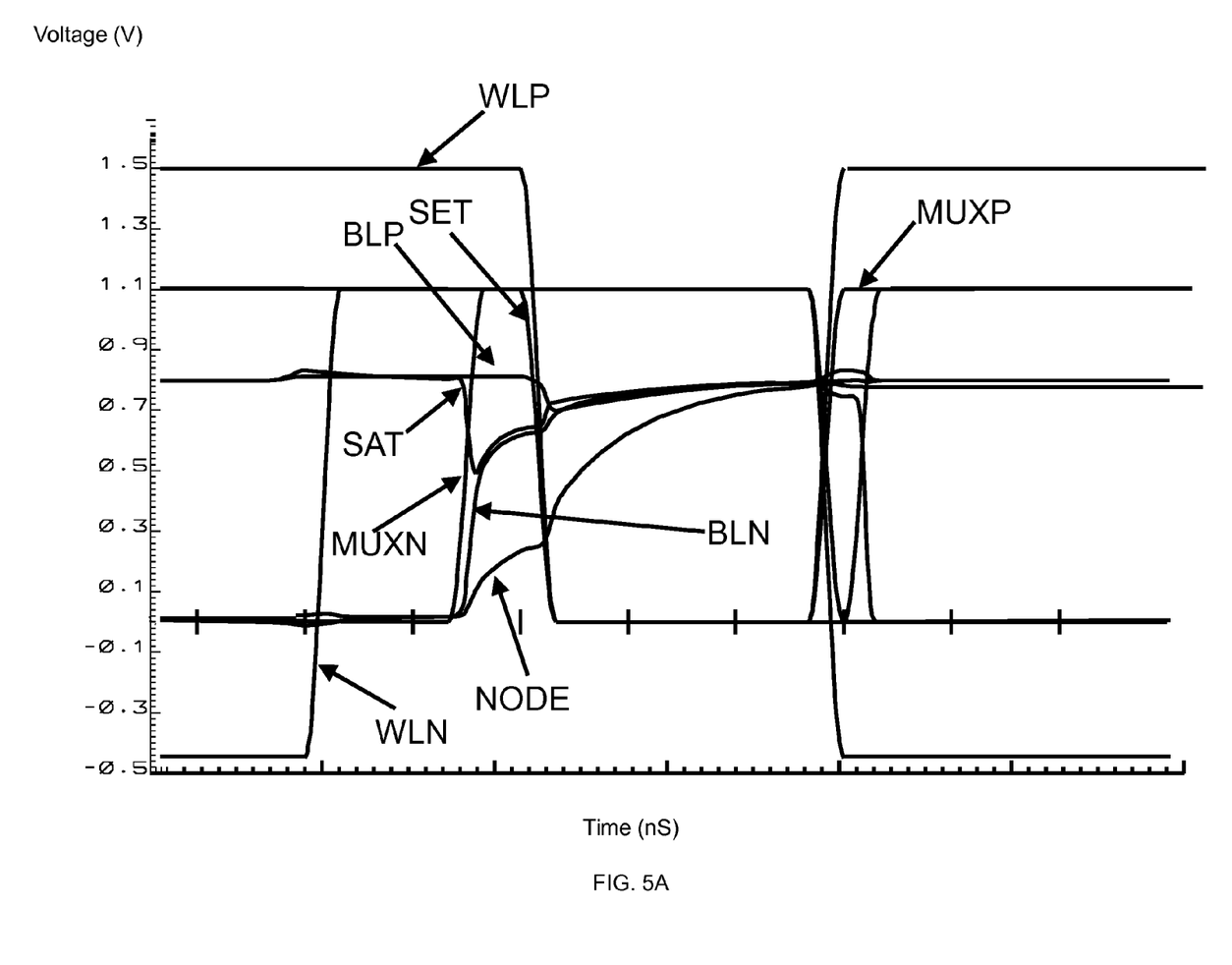
FIGS. 5A-5B show a simulation of the operation of the sense amplifiers depicted in FIGS. 2 and 4 during a write and read of a logical "1" value for a CMOS DRAM cell depicted in FIG. 1, respectively.
Figure 5B:
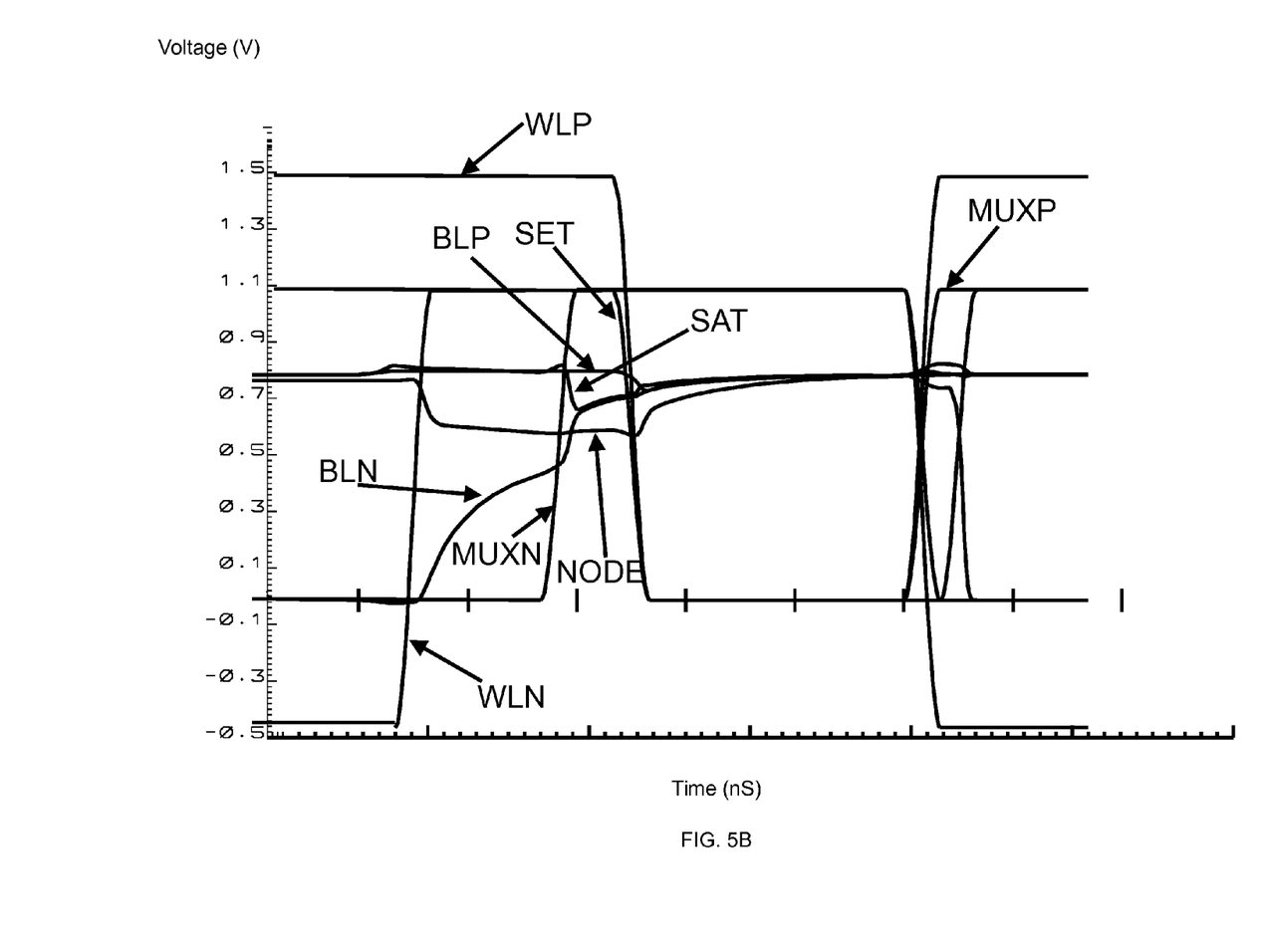
Figure 6A:
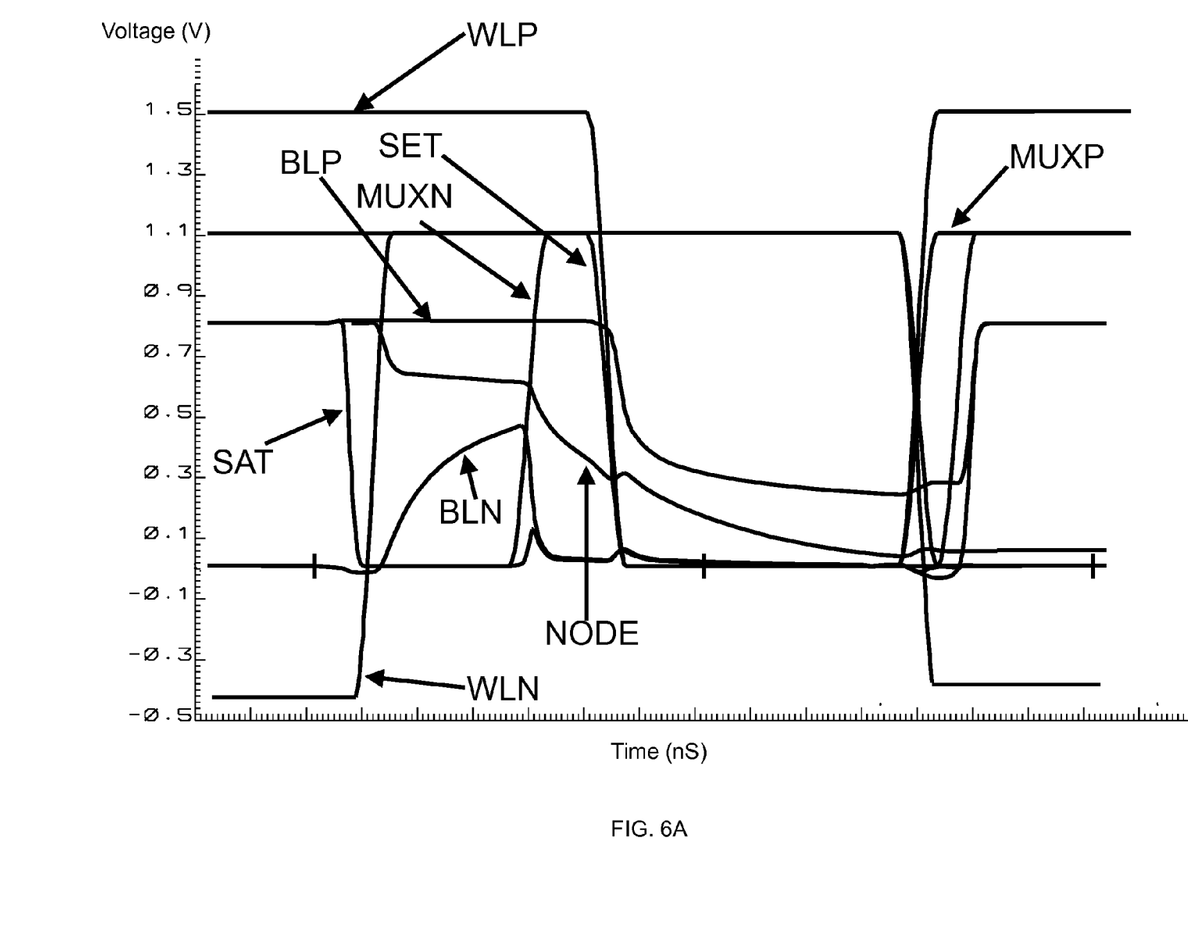
FIGS. 6A-6B shows a simulation of the operation of the sense amplifiers depicted in FIGS. 2 and 4 during a write and read of a logical "0" value for a CMOS DRAM cell depicted in FIG. 1, respectively.
Figure 6B:
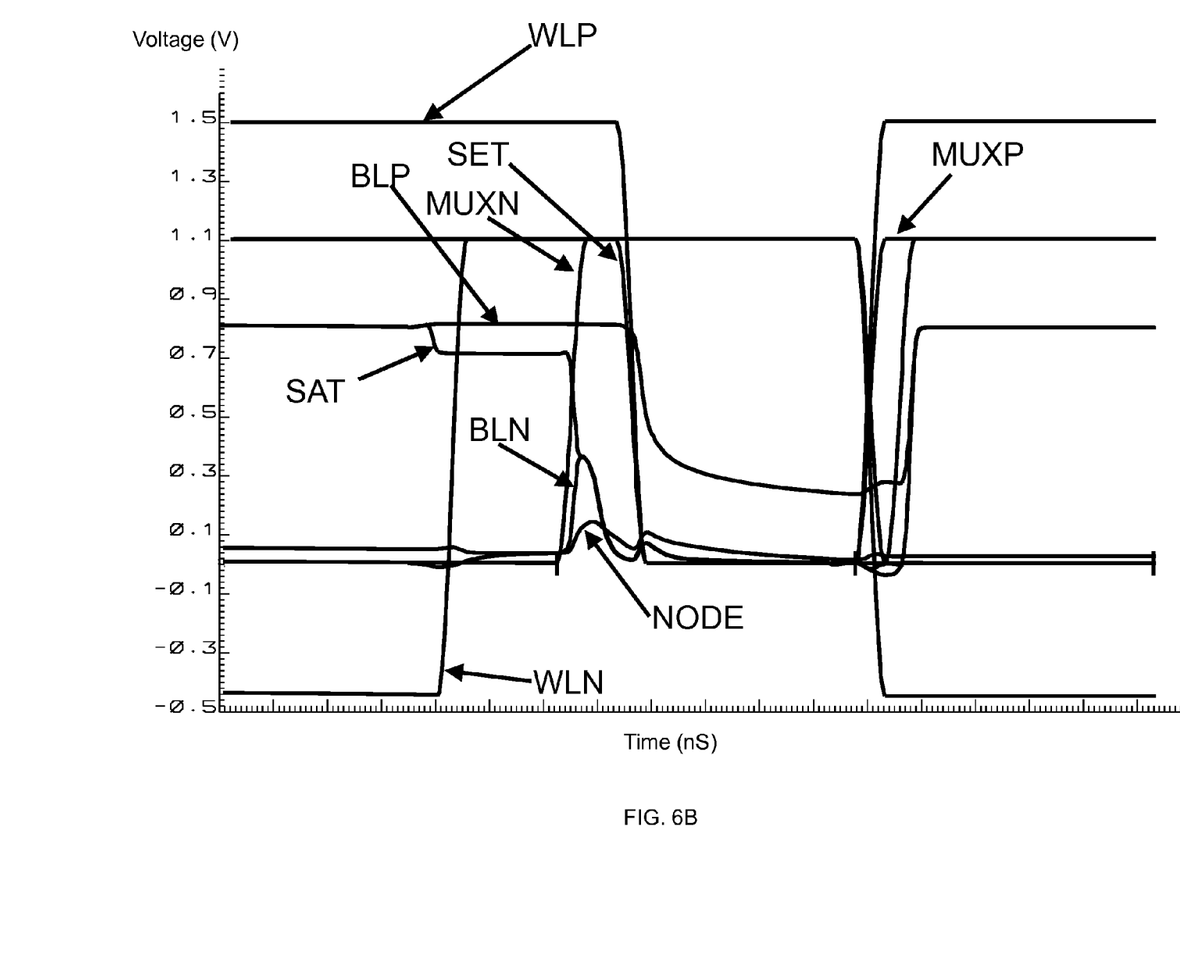

FIGS. 5A-5B and 6A-6B show simulations of the operation of the sense amplifiers depicted in FIGS. 2 and 4. In particular, FIGS. 5A-5B show simulations of the operation of the sense amplifiers depicted in FIGS. 2 and 4 during a write and read of a logical "1" value for a CMOS DRAM cell 105 depicted in FIG. 1, respectively. Similarly, FIGS. 6A-6B show simulations of the operation of the sense amplifiers depicted in FIGS. 2 and 4 during a write and read of a logical "0" value for a CMOS DRAM cell 105 depicted in FIG. 1, respectively. Essentially, the simulations substantiate the operations described above with respect to the timing diagram of FIG. 3, except that these simulations illustrate voltages and times of occurrence for a first word line cycle that writes a "1" and "0", and then for a subsequent word line cycle that reads these values. In particular, the simulations provide the voltage and times for lines WLN, WLP, SET, MUXP, SAT, BLP, BLN and MUXN. Note that for clarity in illustrating these simulations, FIGS. 5A-5B and 6A-6B do not identify simulations of the signals for EQN and SAEQ. Also, the simulations use the label NODE which is not illustrated in the timing diagram of FIG. 3. The label NODE as used in these simulations identifies the data stored in the capacitor of the DRAM cell 105.

As described herein, the various embodiments of the present invention set forth a CMOS DRAM cell with a two bit line configuration. One of these bit lines can be used solely for performing a read operation, while both bit lines can be used to perform a data-dependent write operation. A data-dependent write-back path allows for maximum write-back signal to the DRAM cell through each respective data-dependent path. In addition, the various embodiments of the present invention describe a sense amplifier that is configured to read and write this two bit line DRAM cell structure.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A dynamic random access memory (DRAM) cell, comprising:
    a pair of bit lines;
    a storage capacitor;
    an n-type field-effect transistor (NFET) access transistor selected by a first word line that couples the storage capacitor to one of the pair of bit lines; and
    a p-type field-effect transistor (PFET) access transistor selected by a second word line that couples the storage capacitor to another of the pair of bit lines;
    wherein only one bit line from the pair of bit lines is used to perform a read operation on data in the storage capacitor and both of the bit lines from the pair of bit lines are used to perform a data-dependent write-back operation to the storage capacitor.

2. The DRAM cell according to claim 1, wherein the bit line coupled to the storage capacitor through the NFET access transistor provides a path for the read operation.

3. The DRAM cell according to claim 1, wherein the bit line coupled to the storage capacitor through the NFET access transistor provides a path for writing a logical "0" value back to the storage capacitor.

4. The DRAM cell according to claim 1, wherein the bit line coupled to the storage capacitor through the PFET access transistor provides a path for writing a logical "1" value back to the storage capacitor.

5. The DRAM cell according to claim 1, further comprising a sense amplifier configured to read data in the storage capacitor through only one of the pair of bit lines and write data back to the storage capacitor through both of the pair of bit lines, the bit line from the pair of bit lines used by the sense amplifier to write-back data to the storage capacitor is dependent on a logical value of the data.

6. The DRAM cell according to claim 1, wherein the sense amplifier comprises:
    a precharge component that precharges the pair of bit lines;
    a sense inverter coupled to the pair of bit lines; and
    a write-back component that writes back data from the sense inverter to the storage capacitor along either one of the pair of bit lines.

7. The DRAM cell according to claim 6, wherein the precharge component is configured to precharge the bit line coupled to the PFET access transistor to a voltage supply VDD and precharge the bit line coupled to the NFET access transistor to ground.

8. The DRAM cell according to claim 6, wherein an input of the sense inverter is coupled to both of the pair of bit lines and an output of the sense inverter is coupled to both of the pair of bit lines.

9. The DRAM cell according to claim 6, wherein the write-back component includes a logical "0" write-back path located between the precharge component and the sense inverter, the logical "0" write-back path configured to receive an output from the sense inverter and write back a logical "0" value to the storage capacitor along the bit line coupled to the NFET access transistor.

10. The DRAM cell according to claim 6, wherein the write-back component includes a logical "1" write-back path located between the precharge component and the sense inverter, the logical "1" write-back path configured to receive an output from the sense inverter and write back a logical "1" value to the storage capacitor along the bit line coupled to the PFET access transistor.

11. The DRAM cell according to claim 6, further comprising an isolator device that separates the pair of bit lines from the sense inverter and the write-back component.

12. A circuit, comprising:
    a dynamic random access memory (DRAM) cell including an n-type field-effect transistor (NFET), a p-type field-effect transistor (PFET), and a storage capacitor accessed through both the NFET and the PFET;
    a pair of bit lines formed from a first bit line and a second bit line, the first bit line coupled to the NFET and the second bit line coupled to the PFET; and
    a sense amplifier that reads data in the DRAM cell only through the first bit line and writes back data to the DRAM cell through either the first bit line or the second bit line, wherein the first bit line is used for writing back a logical "0" value to the DRAM cell and the second bit line is used for writing back a logical "1" value to the DRAM cell.

13. The circuit according to claim 12, wherein the sense amplifier comprises:
    a precharge component that precharges the first bit line and the second bit line;
    a sense inverter coupled to the first bit line and the second bit line; and
    a write-back component that writes back data from the sense inverter to the DRAM cell along either the first bit line or the second bit line.

14. The circuit according to claim 13, wherein the precharge component is configured to precharge the first bit line to ground and precharge the second bit line to a voltage supply VDD.

15. The circuit according to claim 13, wherein an input of the sense inverter is coupled to the first bit line and the second bit line, and an output of the sense inverter is coupled to the first bit line and the second bit line.

16. The circuit according to claim 13, wherein the write-back component includes a logical "0" write-back path located between the precharge component and the sense inverter, the logical "0" write-back path configured to receive an output from the sense inverter and write back a logical "0" value to the DRAM cell along the first bit line.

17. The circuit according to claim 16, wherein the write-back component includes a logical "1" write-back path located between the precharge component and the sense inverter, the logical "1" write-back path configured to receive an output from the sense inverter and write back a logical "1" value to the DRAM cell along the second bit line.

18. The circuit according to claim 17, wherein the logical "0" write-back path and the logical "1" write-back path are coupled together by a common node, wherein a first end of the common node is coupled to the first bit line and an input to the sense inverter and a second end of the common node is coupled to the second bit line.

19. The circuit according to claim 18, wherein the logical "0" write-back path includes a common node precharge device that is configured to precharge the common node to a logical "1" value.

20. The circuit according to claim 13, wherein the first bit line and the second bit line are driven to essentially a same voltage level during a write back of a logical "0" value or a logical "1" value to the DRAM cell.

21. A memory circuit, comprising:
at least one dynamic random access memory (DRAM) cell including an n-type field-effect transistor (NFET), a p-type field-effect transistor (PFET), and a storage capacitor accessed through both the NFET and the PFET;
a pair of bit lines formed from a first bit line and a second bit line, the first bit line coupled to the NFET and the second bit line coupled to the PFET; and
a sense amplifier having a single-ended read path and a data-dependent write-back path each coupled to the DRAM cell, wherein the sense amplifier reads data in the DRAM cell only through the first bit line and writes back data to the DRAM cell through one of the first bit line and the second bit line, the first bit line used for writing back a logical "0" value to the DRAM cell and the second bit line used for writing back a logical "1" value to the DRAM cell.

22. The memory circuit according to claim 21, wherein the sense amplifier comprises:
a precharge component that precharges the first bit line and the second bit line, the precharge component precharging the first bit line to ground and precharging the second bit line to a voltage supply VDD;
a sense inverter having an input and an output each coupled to the first bit line and the second bit line; and
a write-back component that writes back data from the sense inverter to the DRAM cell along either the first bit line or the second bit line, the write-back component including a logical "0" write-back path coupling the precharge component and the sense inverter, the logical "0" write-back path receiving a first logical value from the output of the sense inverter and writing a logical "0" value to the DRAM cell along the first bit line, the write-back component further including a logical "1" write-back path coupling the precharge component and the sense inverter, the logical "1" write-back path receiving a second logical value from the output of the sense inverter and writing a logical "1" value to the DRAM cell along the second bit line.

23. The memory circuit according to claim 22, further comprising a node that couples the logical "0" write-back path and the logical "1" write-back path, wherein a first end of the node is coupled to the first bit line and the input of the sense inverter and a second end of the node is coupled to the second bit line.

24. The memory circuit according to claim 23, wherein the logical "0" write-back path includes a common node precharge device that precharges the common node to a logical "1" value.

25. The memory circuit according to claim 21, wherein the first bit line and the second bit line are driven to essentially a same voltage level during a write back of a logical "0" value or a logical "1" value to the DRAM cell.

* * * * *